United States Patent
Lim et al.

(10) Patent No.: US 11,996,275 B2
(45) Date of Patent: May 28, 2024

(54) DEVICE FOR RADICAL DIAGNOSTIC IN PLASMA PROCESSING CHAMBER, RADICAL DIAGNOSTIC SYSTEM HAVING THE SAME, AND OPERATING METHOD THEREOF

(71) Applicant: SAMSUNG ELECTRONICS CO., LTD., Suwon-si (KR)

(72) Inventors: Sungyong Lim, Seoul (KR); Chansoo Kang, Hwaseong-si (KR); Youngdo Kim, Hwaseong-si (KR); Namkyun Kim, Pyeongtaek-si (KR); Sungyeol Kim, Yongin-si (KR); Sangki Nam, Seongnam-si (KR); Seungbo Shim, Seoul (KR); Kyungmin Lee, Gwacheon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 17/942,368

(22) Filed: Sep. 12, 2022

(65) Prior Publication Data
US 2023/0197423 A1 Jun. 22, 2023

(30) Foreign Application Priority Data
Dec. 17, 2021 (KR) .................. 10-2021-0181314

(51) Int. Cl.
*H01J 37/32* (2006.01)
*G01J 1/44* (2006.01)

(52) U.S. Cl.
CPC .......... *H01J 37/32935* (2013.01); *G01J 1/44* (2013.01); *H01J 37/32174* (2013.01); *G01J 2001/446* (2013.01)

(58) Field of Classification Search
CPC .......... H01J 37/32935; H01J 37/32174; H01J 37/32972; G01J 1/44; G01J 2001/446; G01J 3/443; G01J 3/28; G01J 2003/003
See application file for complete search history.

(56) References Cited

U.S. PATENT DOCUMENTS

| | | |
|---|---|---|
| 6,828,165 B2 | 12/2004 | Tanaka et al. |
| 9,200,950 B2 | 12/2015 | Lian et al. |
| 9,310,250 B1 | 4/2016 | Bullock et al. |
| 9,466,466 B1 | 10/2016 | Zhong et al. |
| 9,564,295 B2 | 2/2017 | Lee et al. |
| 9,627,186 B2 | 4/2017 | Valcore, Jr. et al. |
| 9,842,726 B2 | 12/2017 | Daniels et al. |
| 10,249,485 B2 | 4/2019 | Volynets et al. |

(Continued)

FOREIGN PATENT DOCUMENTS

KR 10-2018-0084456 A 7/2018

*Primary Examiner* — Thanh Luu
*Assistant Examiner* — Monica T Taba
(74) *Attorney, Agent, or Firm* — Fish & Richardson P.C.

(57) ABSTRACT

A diagnostic device for diagnosing distribution of a radical in a plasma processing chamber, the diagnostic device, may include a spectrometer receiving an optical signal through at least one optical channel connected to the plasma processing chamber, and performing spectral analysis on the optical signal in response to a synchronization signal corresponding to each of states of a multi-level pulse applied to the plasma processing chamber and a synchronizer generating the synchronization signal corresponding to each of the states of the multi-level pulse.

18 Claims, 19 Drawing Sheets

(56) References Cited

U.S. PATENT DOCUMENTS

| | | |
|---|---|---|
| 10,340,135 B2 | 7/2019 | Blanquart |
| 10,410,836 B2 | 9/2019 | McChesney et al. |
| 2002/0094484 A1 | 7/2002 | Buchsbaum et al. |
| 2004/0179187 A1 | 9/2004 | Mettes |
| 2004/0185582 A1 | 9/2004 | Kueny |
| 2005/0151544 A1 | 7/2005 | Mahoney et al. |
| 2006/0048891 A1* | 3/2006 | Yue .................. H01J 37/32935 |
| | | 156/345.25 |
| 2007/0264841 A1 | 11/2007 | Chebi et al. |
| 2009/0086049 A1* | 4/2009 | Fujita .................. H04N 25/745 |
| | | 348/222.1 |
| 2009/0090616 A1 | 4/2009 | Du et al. |
| 2011/0013175 A1 | 1/2011 | Davis et al. |
| 2014/0131314 A1 | 5/2014 | Ando et al. |
| 2015/0002018 A1 | 1/2015 | Lill et al. |
| 2015/0069912 A1 | 3/2015 | Valcore, Jr. et al. |
| 2015/0124250 A1* | 5/2015 | Bao ........................ G01N 21/68 |
| | | 356/316 |
| 2015/0311129 A1 | 10/2015 | Miller et al. |
| 2016/0148786 A1 | 5/2016 | Marakhtanov et al. |
| 2016/0169814 A1 | 6/2016 | Hashimoto et al. |
| 2016/0349381 A1 | 12/2016 | Friedman |
| 2017/0062290 A1 | 3/2017 | Miller et al. |
| 2017/0140905 A1 | 5/2017 | Mihaylov et al. |
| 2018/0038800 A1 | 2/2018 | Gamache |
| 2018/0130651 A1* | 5/2018 | Volynets .................. H01J 49/40 |
| 2018/0286650 A1* | 10/2018 | Bullock ............... H04N 25/713 |
| 2019/0103253 A1 | 4/2019 | Lill et al. |
| 2019/0148112 A1 | 5/2019 | Kaneko et al. |
| 2022/0216038 A1* | 7/2022 | Wu .................. H01J 37/32146 |
| 2023/0230805 A1* | 7/2023 | Drewery ........... H01J 37/32174 |
| | | 315/111.21 |

* cited by examiner

DEVICE FOR RADICAL DIAGNOSTIC IN PLASMA PROCESSING CHAMBER, RADICAL DIAGNOSTIC SYSTEM HAVING THE SAME, AND OPERATING METHOD THEREOF

CROSS-REFERENCE TO RELATED APPLICATION

This application claims benefit of priority to Korean Patent Application No. 10-2021-0181314 filed on Dec. 17, 2021, in the Korean Intellectual Property Office, the disclosure of which is incorporated herein by reference in its entirety.

BACKGROUND

1. Field

Embodiments relate to a device for diagnosing a radical, a system for diagnosing a radical having the same, and an operating method thereof.

2. Description of the Related Art

A plasma apparatus coupled to a plasma processing chamber may be used to perform an etching process on a semiconductor substrate, or the like. Power applied to the plasma processing chamber may be combined with process gases inside the plasma processing chamber to form a plasma for the etching process.

SUMMARY

According to embodiment, a diagnostic device for diagnosing distribution of a radical in a plasma processing chamber, the diagnostic device, may include: a spectrometer receiving an optical signal through at least one optical channel connected to the plasma processing chamber, and performing spectral analysis on the optical signal in response to a synchronization signal corresponding to each of states of a multi-level pulse applied to the plasma processing chamber; and a synchronizer generating the synchronization signal corresponding to each of the states of the multi-level pulse.

According to an embodiment, a system for diagnosing a radical, may include: a plasma processing chamber; a multi-level pulse generator applying a multi-level pulse to the plasma processing chamber; a pulse controller controlling the multi-level pulse generator; a bias matcher for minimizing reflected power reflected from the plasma processing chamber; and a diagnostic device connected to the plasma processing chamber through at least one optical channel, receiving an optical signal through the at least one optical channel, and diagnosing a radical or analyzing behavior of the radical by performing spectral analysis of the optical signal for each of states of the multi-level pulse.

According to an embodiment, an operating method of a diagnostic device for diagnosing distribution of a radical in a plasma processing chamber, may include: an operation of synchronizing control signals according to a multi-level pulse applied to the plasma processing chamber; an operation of receiving an optical signal from the plasma processing chamber, by operating a pixel of an image sensor according to the control signals; and an operation of performing spectral analysis on the optical signal to analyze distribution of a radical and behavior of the radical for each of states of the multi-level pulse.

According to an embodiment, a plasma diagnostic device, may include: a plasma processing chamber; a first collimator and machine holder disposed in a first window of the plasma processing chamber; a second collimator and machine holder disposed in a second window of the plasma processing chamber; and a spectrometer connected to an optical channel from each of the first and second collimators and machine holders, collecting an optical signal received through the optical channel with an image sensor, and analyzing a spectrum for the collected optical signal; and a computing device analyzing distribution of a radical in the plasma processing chamber and behavior of the radical using data analyzed from the spectrometer.

BRIEF DESCRIPTION OF DRAWINGS

Features will become apparent to those of skill in the art by describing in detail example embodiments with reference to the attached drawings in which.

DETAILED DESCRIPTION

A diagnostic device for diagnosing a radical in a plasma processing chamber, a system for diagnosing a radical including the same, and an operating method thereof according to an example embodiment may analyze distribution of a radical and behavior thereof in each state in a plasma processing chamber using radio-frequency (RF) multi-level pulses or gas pulsing.

Figure 1:
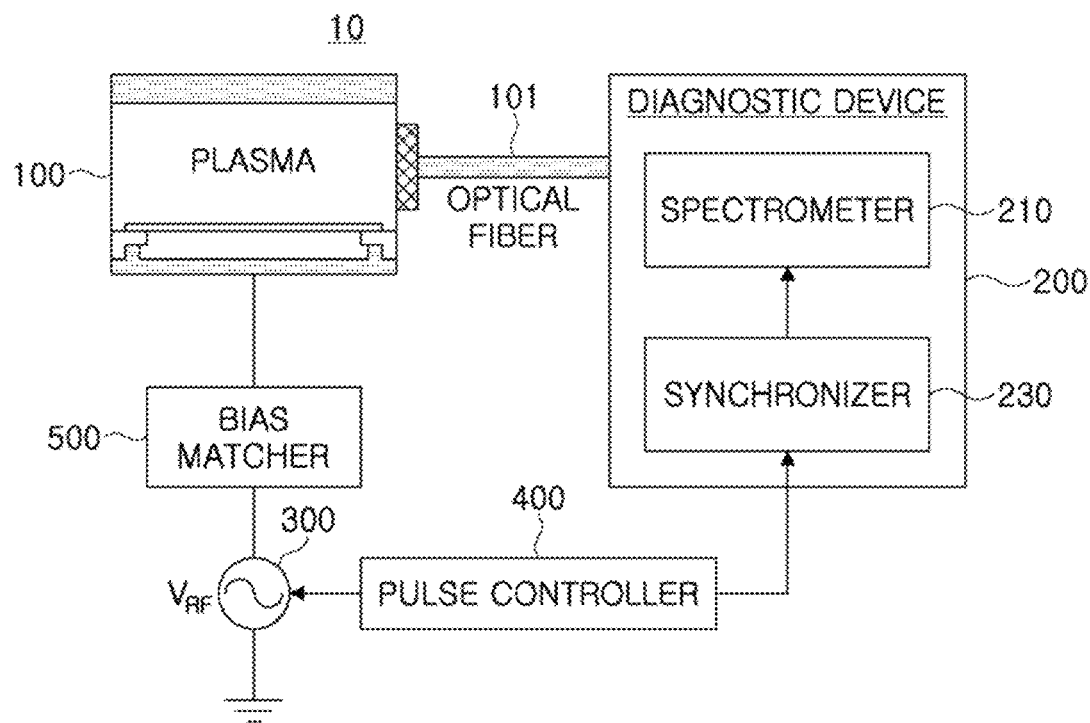
FIG. 1 is a view exemplarily illustrating a system for diagnosing a radical of a plasma processing chamber according to an example embodiment.

FIG. 1 is a view exemplarily illustrating a system for diagnosing a radical of a plasma processing chamber according to an example embodiment.

Referring to FIG. 1, the radical diagnostic system 10 may include a plasma processing chamber 100, a diagnostic device 200, a multi-level pulse generator 300, a pulse controller 400, and a bias matcher 500.

The plasma processing chamber 100 may include a vacuum chamber, an upper electrode, a lower electrode, and a plasma and process gas supply unit. The upper electrode may be disposed above a vacuum container, and the lower electrode may be disposed below the vacuum container. The lower electrode may be disposed below the upper electrode. RF (Radio Frequency) power (or multi-level pulses) generated from the upper electrode or the lower electrode may be combined with plasma. In an example embodiment, the upper electrode or the lower electrode may inductively couple power to the process gases supplied to an inside of the vacuum container by the process gas supply unit. RF power applied by the upper electrode or the lower electrode may be inductively coupled to the process gases to form plasma in a reaction region on a semiconductor wafer substrate. Process gases supplied from the process gas supply unit may etch materials on the semiconductor wafer substrate. In an example embodiment, the process gas may include $C_xF_y$. In an example embodiment, the RF power applied from the upper electrode may ignite the plasma, and the RF power applied from the lower electrode may control ions and radicals of the plasma.

The diagnostic device 200 may be connected to the plasma processing chamber 100 through an optical channel 101, which may include an optical fiber. The diagnostic device 200 may be implemented to analyze a radical and behavior of the radical by performing spectral analysis in real time for each of states of the multi-level pulse (or RF power) of the plasma processing chamber 100.

The diagnostic device 200 may include a spectrometer 210 and a synchronizer 230. The spectrometer 210 may be implemented to analyze a spectrum of an optical signal received through the optical channel. For example, the spectrometer 210 may be implemented to synchronize to a multi-level pulse and analyze the spectrum according to each of states via an image sensor (CMOS image sensor, CCD image sensor, or the like). The states may correspond to a level of a multi-level pulse. The spectrometer 210 may be implemented to log-convert an output signal of the image sensor. The synchronizer 230 may be implemented to receive a trigger signal from the outside, and synchronize control signals for controlling the spectrometer 210 in response to the trigger signal. The trigger signal may be provided from the pulse controller 400, which may be external. The synchronizer 230 may be implemented to synchronize multi-level pulses and control signals. For example, the synchronizing of the control signals in a section of each state of the multi-level pulse may be used to control a storage operation, a transfer operation, and reset gate operation of an image sensor of the spectrometer 210. Thereby, electronic-shuttering of the image sensor may be performed. As a result, plasma emission data in each state of the multi-level pulse may be obtained.

The multi-level pulse generator 300 may be implemented to generate RF power as a multi-level pulse. For example, the multi-level pulse generator 300 may generate a multi-level pulse using a desired phase, delay, or duty cycle between pulses of a very high frequency power generator and RF frequency power generators. However, the multi-level pulse may be generated by, e.g., an RF generator, a mid frequency (MF) generator, a high frequency (HF) generator, or a very high frequency (VHF) generator.

The pulse controller 400 may be implemented to control a desired phase, delay, or duty cycle between pulses of a very high frequency source power generator and RF bias power generators. The pulse controller 400 may be implemented to generate a trigger signal corresponding to each state of the multi-level pulse, and to output the trigger signal to the synchronizer 230 of the diagnostic device 200.

The bias matcher 500 may be implemented to minimize reflected power reflected from the plasma processing chamber 100. The bias matcher 500 may equally match impedance of the plasma processing chamber 100 and impedance of the multi-level pulse generator 300 in order to minimize the reflected power. In an example embodiment, complex impedance of the plasma processing chamber 100 and complex impedance of the multi-level pulse generator 300 may be matched to 50Ω. In an example embodiment, the bias matcher 500 may be implemented to match input impedance corresponding to the multi-level pulse to the plasma load in real time.

While a semiconductor wafer substrate is etched in the plasma processing chamber 100, characteristics of plasma may change. To facilitate dynamic matching as the characteristics of the plasma change, the bias matcher 500 may be continuously adjusted through a matching network to achieve and maintain matching throughout an etching process.

In general, as devices become more advanced, e.g., as a generation of a vertical-type NAND flash memory device evolves, a number of stacking stages may increase. Accordingly, there may be a demand for a high-level etching process capable of etching with a high aspect ratio and a facility that enables it. By using multi-level pulsed plasma, it may be possible to achieve high-selectivity etching. Accordingly, facilities supporting multi-level pulsed plasma are increasing. A general radical diagnostic system cannot analyze a radical for a specific state by averaging and analyzing plasma emission light of the plasma processing chamber with respect to the accumulated time.

On the other hand, the radical diagnostic system 10 according to the present example embodiment may perform spectrum analysis using an image sensor for each state in a plasma processing chamber using a multi-level pulse, so that distribution of a radical and behavior of the radical according to each state can be analyzed.

Figure 2A:
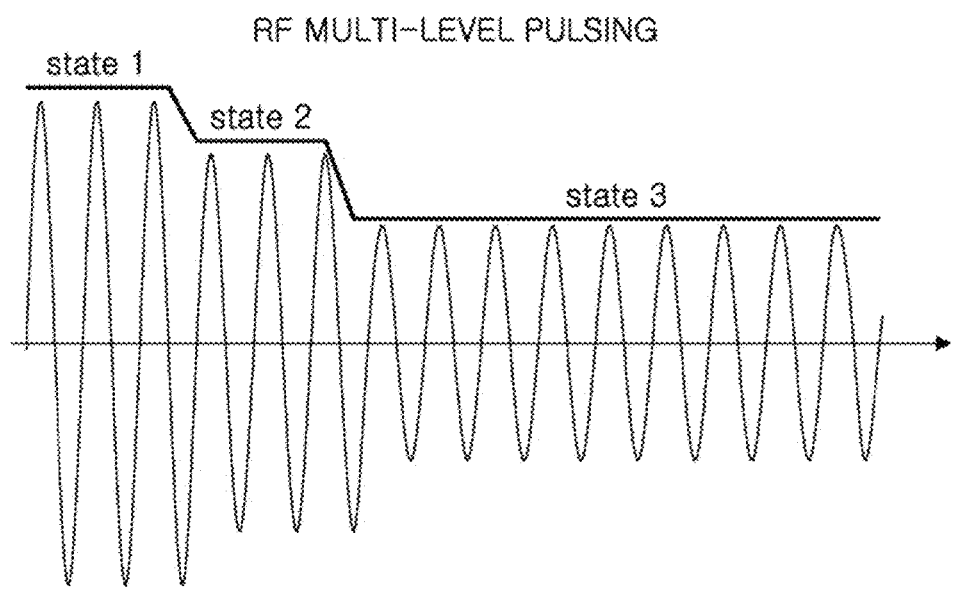
FIGS. 2A, 2B, and 2C are diagrams conceptually illustrating an effect of the radical diagnostic device according to an example embodiment.
Figure 2B:
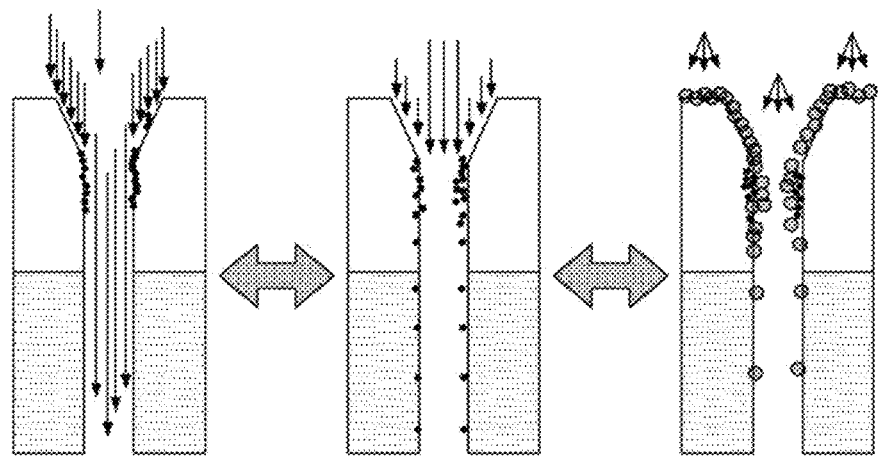
Figure 2C:
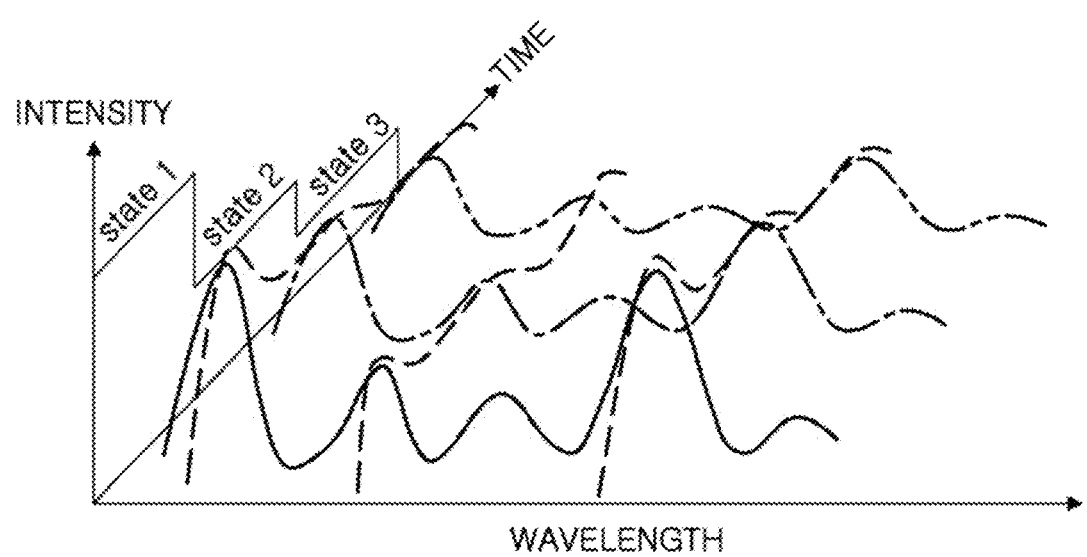

FIGS. 2A, 2B, and 2C are diagrams for conceptually illustrating an effect of a radical diagnostic device according to an example embodiment.

In general, in the case of multi-level pulsed plasma, it may be important to analyze for each state because the desired distribution ratio and effect of radicals are different for each state.

By way of example, referring to FIGS. 2A and 2B, a first state indicates a multi-level pulse in an etching process, a second state indicates a multi-level pulse in clogging and bowing, and a third state indicates a multi-level pulse in passivation. For example, in a period of the first state, the spectrometer 210 (refer to FIG. 1) may be performing monitoring of etchant radicals and by-products in the etching process region. In a section of the third state, the spectrometer 210 may be performing radical monitoring of a polymer serving as passivation of a top mask. In optimizing an etching profile, it may be important to monitor an optimal radical ratio and reaction in the first and third states in the spectrometer 210.

Referring to FIG. 2C, emission distribution and behavioral characteristics of respective radicals in states of the RF multi-level pulse can be simultaneously analyzed in three dimensions. For example, spectral analysis of radicals for each state may be performed. In addition, it may be possible to analyze the behavioral characteristics of radicals for each state (creation and extinction). In addition, an optimization time of the process profile through real-time analysis of the radical reaction for each state can be shortened. Accordingly, it may be possible to dynamically analyze the etching process. This can be used for, e.g., etching profile modeling.

The diagnostic device 200 according to the present example embodiment may analyze a distribution ratio of radical and a behavior of each major radical for each state period. Accordingly, the diagnostic device 200 may quickly and accurately find an optimal radical ratio selection and RF multi-level pulse conditions.

Figure 3:
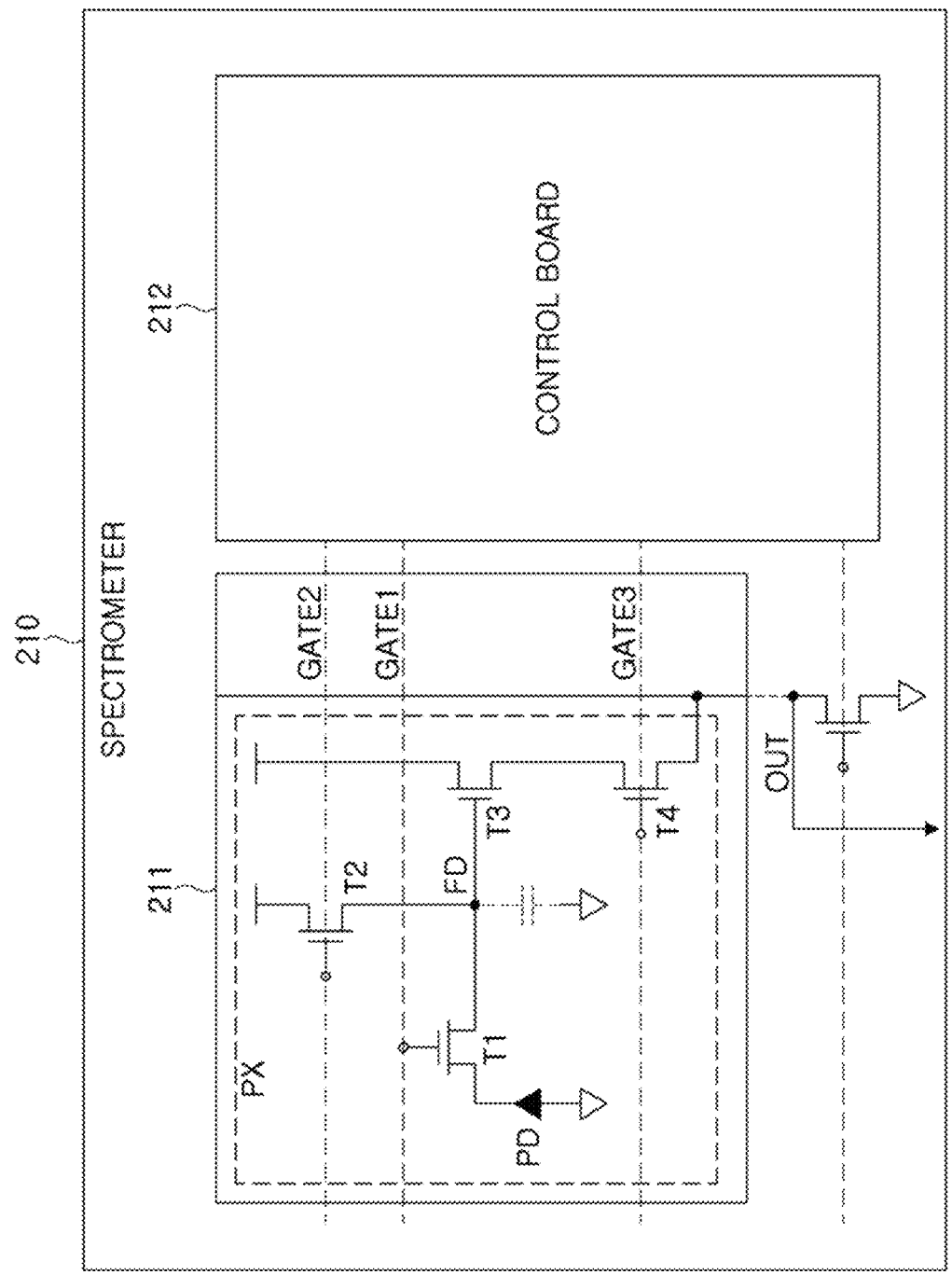
FIG. 3 is a view exemplarily illustrating a spectrometer 210 according to an example embodiment.

FIG. 3 is a view exemplarily illustrating a spectrometer 210 according to an example embodiment.

Referring to FIG. 3, the spectrometer 210 may include a pixel array 211 and a control board 212. In an example embodiment, the spectrometer 210 may be implemented as an image sensor capable of gate control. In an example embodiment, the image sensor may include a Charge Coupled Device (CCD) image sensor. In another example embodiment, the image sensor may include a complementary metal oxide semiconductor (CMOS) image sensor.

The pixel array 211 may include a plurality of pixels connected to a plurality of row lines (gate lines) and a plurality of column lines. In FIG. 3, only one pixel PX is illustrated for convenience of description.

The control board 212 may be implemented to output gate signals GATE1, GATE2, and GATE3 for driving the pixel array 211. The control board 212 may be implemented to digitally convert signals output from the pixel array 211.

The control board 212 may include a memory for storing an algorithm performing an operation of obtaining and analyzing spectral data for each state of a multi-level pulse, and at least one processor for driving the algorithm. In an example embodiment, the control board 212 may be implemented with discrete or integrated analog circuit units, Field Programmable Gate Arrays (FPGAs), Application Specific Integrated Circuits (ASICs), or a combination thereof.

Figure 4A:
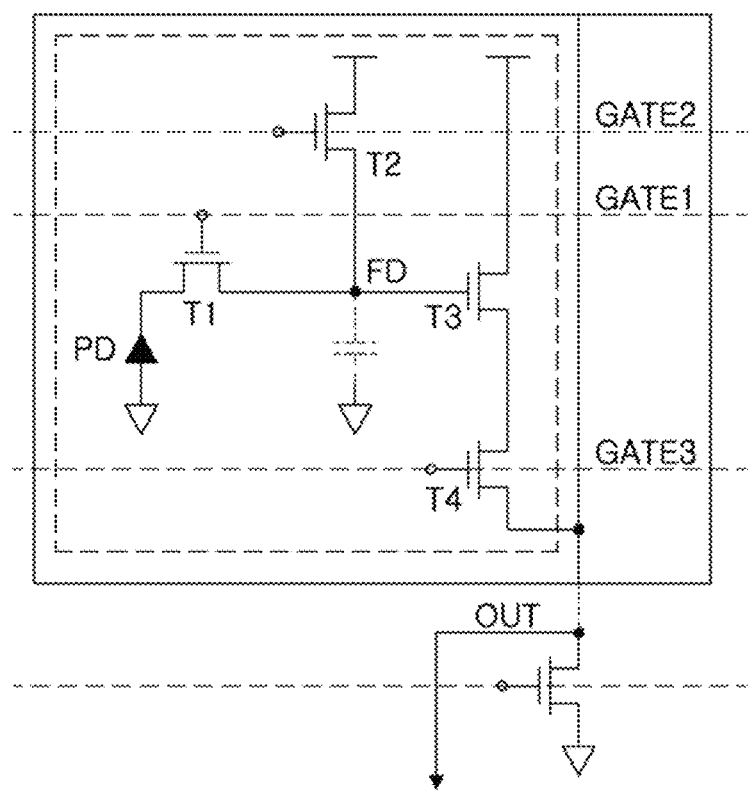
FIGS. 4A and 4B are diagrams exemplarily illustrating an operation of a pixel array 211 according to an example embodiment.
Figure 4B:
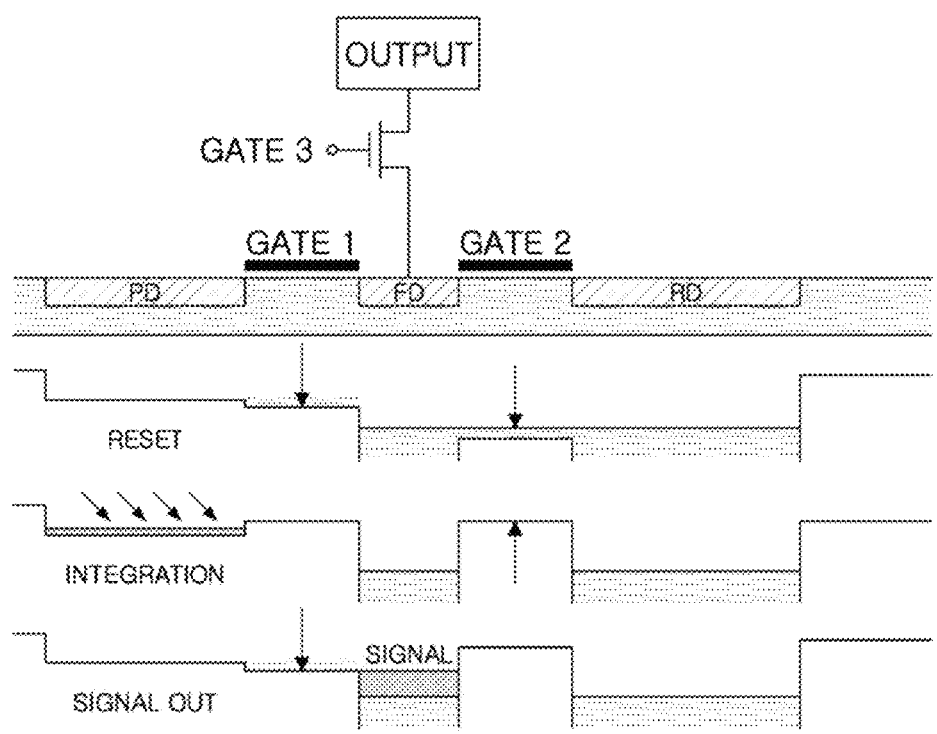

FIGS. 4A and 4B are diagrams exemplarily illustrating an operation of the pixel array 211 according to an example embodiment.

Referring to FIG. 4A, the pixel PX may be operated by first to third gate signals GATE1, GATE2, and GATE3. The pixel PX shown in FIG. 4A may be implemented with a 4-Tr structure including transistors T1 to T4, for example.

Referring to FIG. 4B, the pixel PX may perform a reset operation, an integration operation, and a signal output operation according to control of the gate signals GATE1, GATE2, and GATE3.

In the reset operation, a first transistor T1 and a second transistor T2 may be turned on according to the control of the first gate signal GATE1 and the second gate signal GATE2, so that a charge in a reset state, for example, a charge of a reset diffusion region RD, may be transferred to a floating diffusion region FD.

In the integration operation, the first transistor T1 and the second transistor T2 may be turned off according to control of the first gate signal GATE1 and the second gate signal GATE2, and a charge corresponding to an optical signal obtained through an optical channel may be accumulated in a photodiode PD.

In the signal output operation, as the first transistor T1 is turned on according to control of the first gate signal GATE1, the charge corresponding to the optical signal may be transferred to a floating diffusion region FD. Thereafter, as a third transistor T4 is turned on according to control of the third gate signal GATE3, a voltage corresponding to a signal transmitted to the floating diffusion region FD may be output externally.

It should be understood that the above-described pixel operation is merely an example embodiment.

Figure 5:
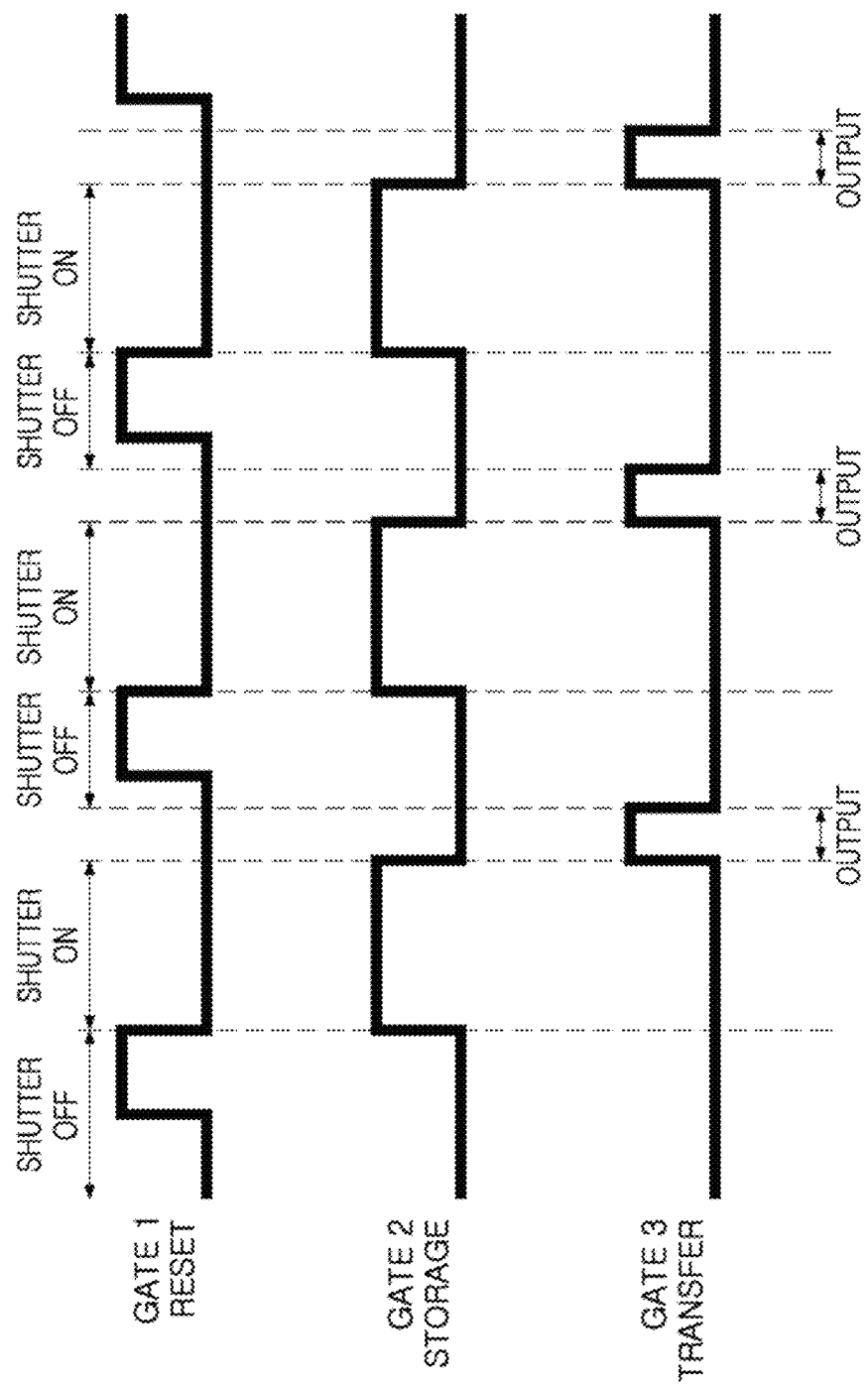
FIG. 5 is a diagram of an example of a gate timing for controlling the spectrometer 210 according to an example embodiment.

FIG. 5 is a diagram of an example of gate timing for controlling the spectrometer 210 according to an example embodiment.

Electronic-shuttering may be performed by controlling the store operation, transfer operation, and reset gate operation of the image sensor in synchronization with each state of the RF multi-level pulse. Thereby, spectral data of plasma in each state may be obtained.

Referring to FIG. 5, the gate timing operation may be divided into an electronic-shuttering blocking operation, an electronic shuttering open operation, and a signal output operation.

In the electronic-shuttering blocking operation, plasma emission data is not collected. In this case, a reset gate transistor T2 is in a turned-on state, the storage gate transistor T1 is in a turned-on state, and the transfer gate transistor T4 is in a turned-off state.

In an electro-shuttering open operation, plasma emission data may be collected. In this case, the reset gate transistor T2 is in a turned-on state, the storage gate transistor T1 is in a turned-off state, and the transfer gate transistor T4 is in a turned-off state.

In the signal output operation, the collected data may be output. In this case, the reset gate transistor T2 is in a turned-off state, the storage gate transistor T1 is in a turned-on state, and the transfer gate transistor T4 is in a turned-on state.

Figure 6:
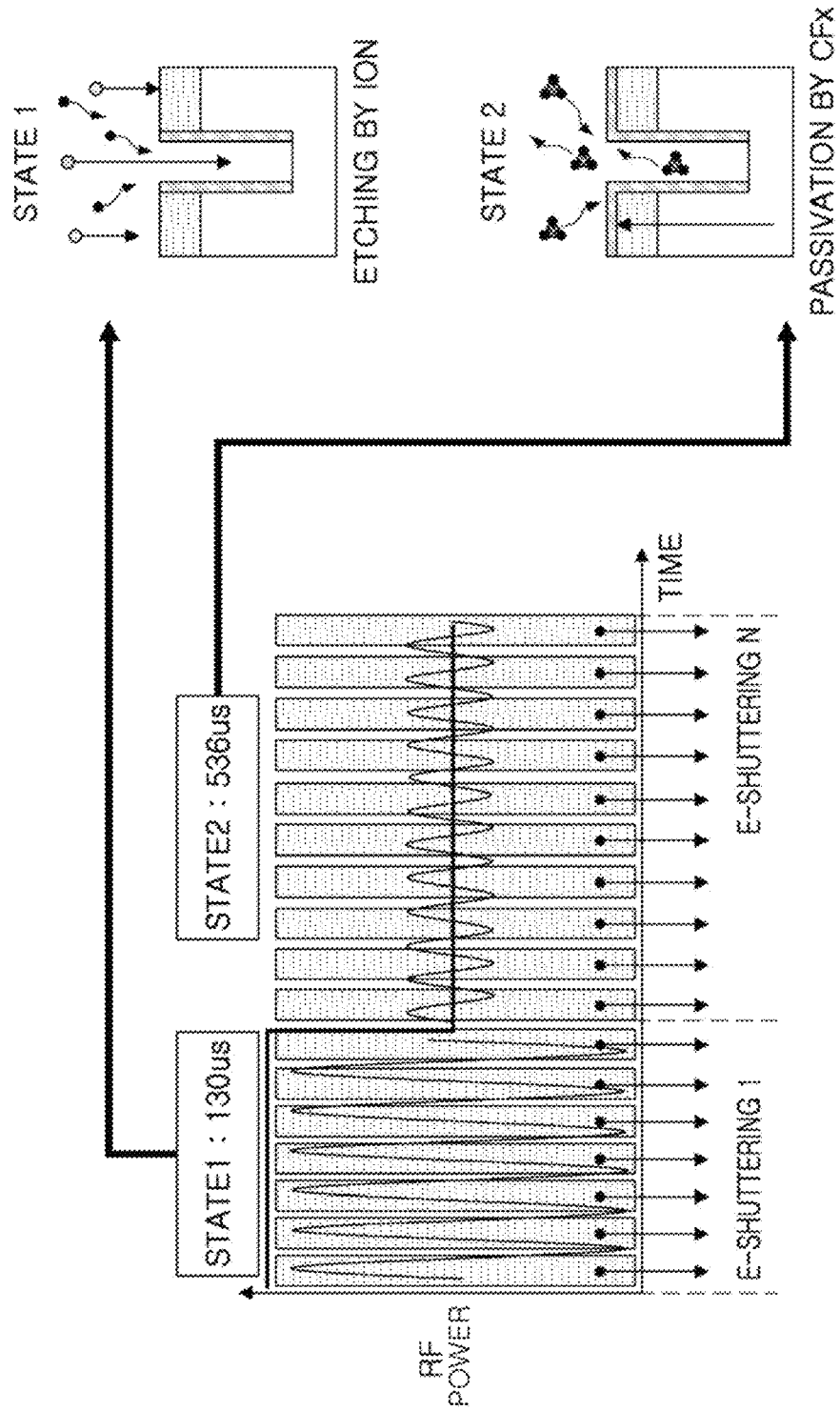
FIG. 6 is a diagram exemplarily illustrating a process of electronic-shuttering by controlling a storage, transfer, and reset gate for each state in the diagnostic device 200 according to an example embodiment.

FIG. 6 is a diagram exemplarily illustrating a process of electronic-shuttering by controlling a storage, transfer, and reset gate for each state in the diagnostic device 200 according to an example embodiment.

Referring to FIG. 6, in a first state, the diagnostic device 200 may observe a portion etched by ions. In an example embodiment, a period of the first state may be 130 μs. In a second state, the diagnostic device 200 may observe formation of a protective layer by CFx. In an example embodiment, a period of the second state may be 536 μs. It should be understood that the stated periods of the first state and the period of the second state are merely examples. Referring to FIG. 6, electronic-shuttering may be performed N times in periods of the first and second states.

Figure 7:
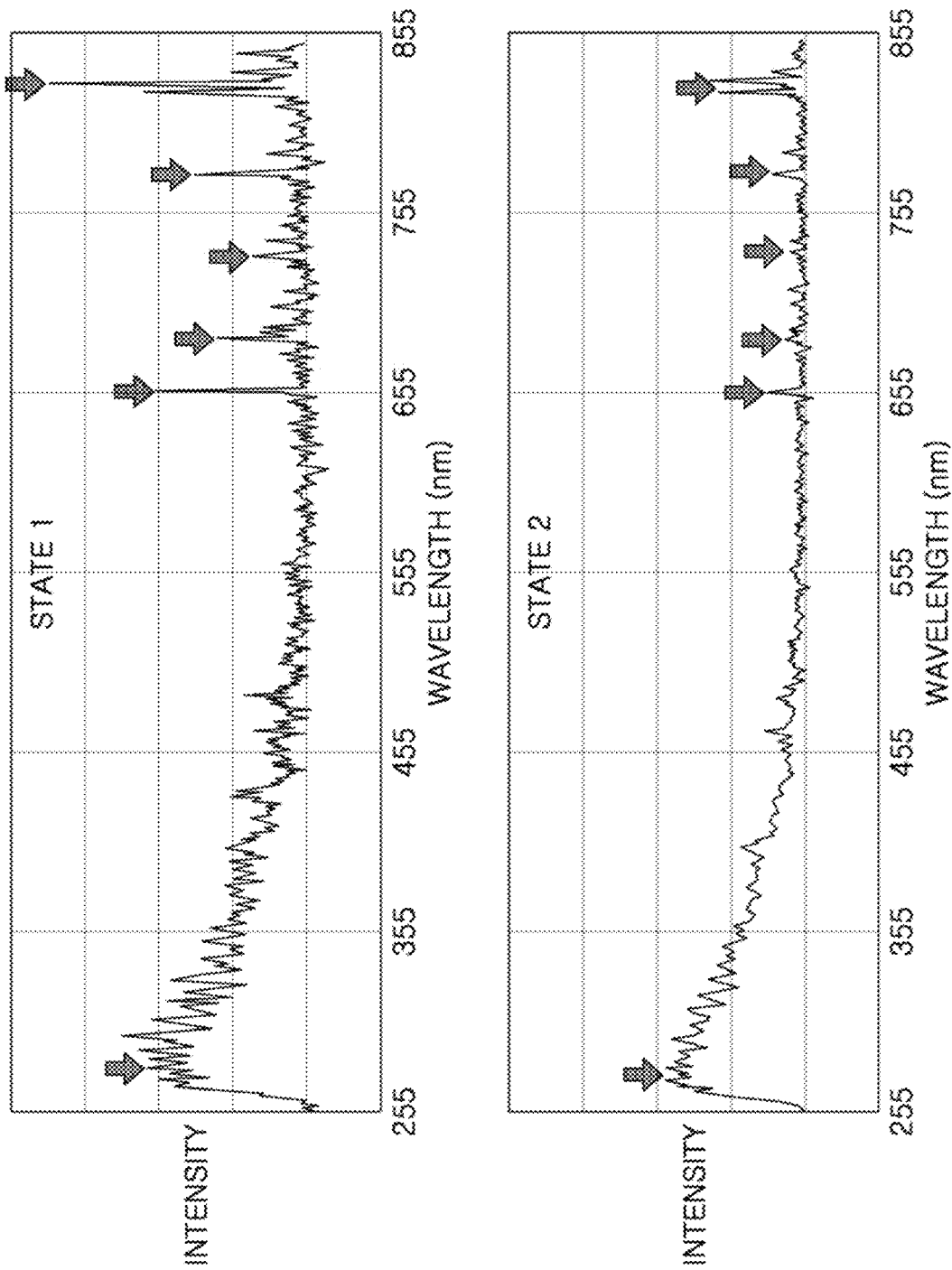
FIG. 7 is a view exemplarily illustrating evaluation data for each state according to an example embodiment.

FIG. 7 is a view exemplarily illustrating evaluation data for each state according to an example embodiment.

Referring to FIG. 7, plasma emission data for each state of an RF multi-level pulse may be obtained by a plurality of electronic-shuttering operations. Accordingly, it may be possible to analyze a change in plasma radical distribution (i.e., spectrum data) for each state. It may also be possible to analyze a chemical reaction of a wafer through analysis of a change in intensity of by-products radical for each state.

Figure 8:
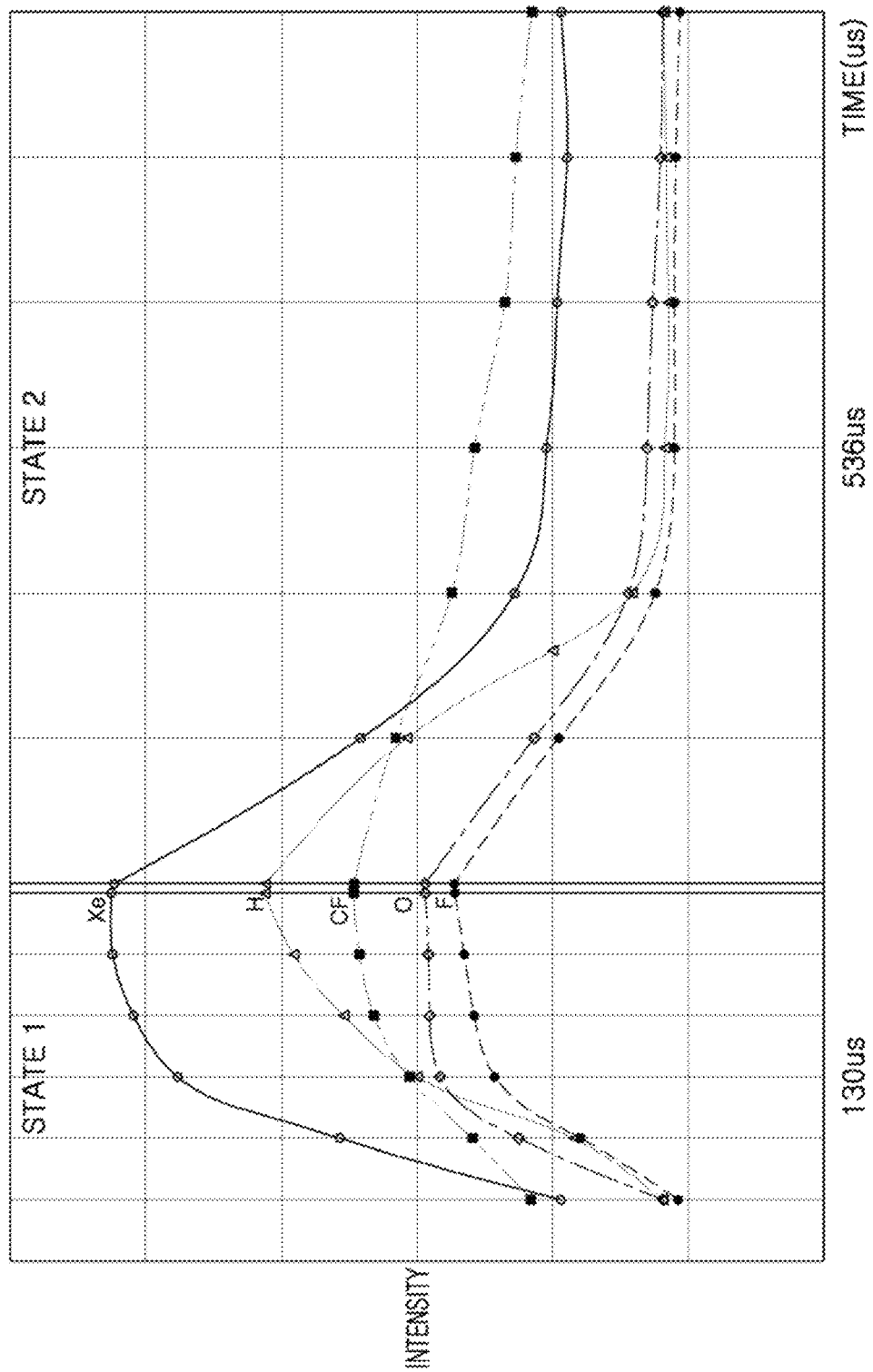
FIG. 8 is a diagram illustrating a change in a time trend of major radical for each state by the diagnostic device 200 according to an example embodiment.

FIG. 8 is a diagram illustrating a change in a time trend of major radical for each state by the diagnostic device 200 according to an example embodiment.

Referring to FIG. 8, it may be possible to confirm a change in dissociation in each state period for each radical.

It may be possible to simultaneously acquire information on behavior (time trend data of creation and extinction) of a radical for each state of the RF multi-level pulse. It may be possible to analyze the radical dissociation characteristics of plasma for each state at the same time. For example, it may be possible to analyze the dissociation characteristics of polyatomic molecules and monoatomic molecules. Referring to FIG. 8, it may be possible to analyze by-product-based radicals generated during etching of wafers for each state and CFx-based behaviors for a passivation role. Dynamic analysis of etching may be performed through this effect.

Referring again to FIG. 1, although the synchronizer 230 is described as being synchronized with a signal by an external trigger, the synchronizer may be synchronized by an internal sensor of the diagnostic device.

Figure 9:
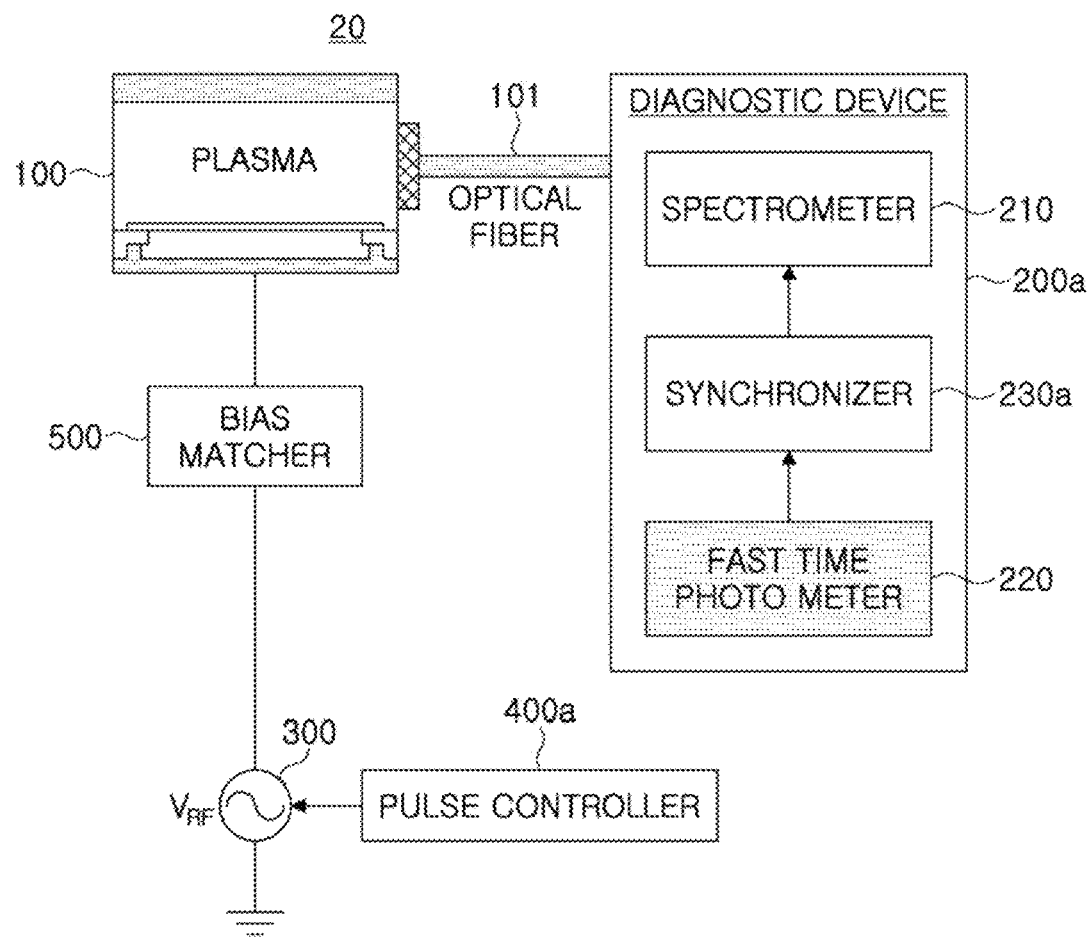
FIG. 9 is a diagram exemplarily illustrating a system for diagnosing a radical in a plasma processing chamber according to another example embodiment.

FIG. 9 is a diagram exemplarily illustrating a system for diagnosing a radical of a plasma processing chamber according to an example embodiment.

Referring to FIG. 9, a system for diagnosing a radical 20 may include the plasma processing chamber 100, a diagnostic device 200a, the multi-level pulse generator 300, a pulse generator 400a, and the bias matcher 500.

The diagnostic device 200a may further include an internal sensor 220, as compared to the diagnostic device 200 illustrated in FIG. 1. The internal sensor 220 may be implemented to be synchronized with an envelope signal of an optical pulse. In an example embodiment, the internal sensor 220 may include a fast time photo meter. The fast time photo meter may be a light receiving device including photomultiplier tubes (PMTs) or photodiodes. The fast time photo meter is a pulse-type diagnostic device using an optical signal emitted from a plasma processing chamber.

In another example embodiment, the synchronizer may be synchronized by an external sensor (VI Sensor).

Figure 10:
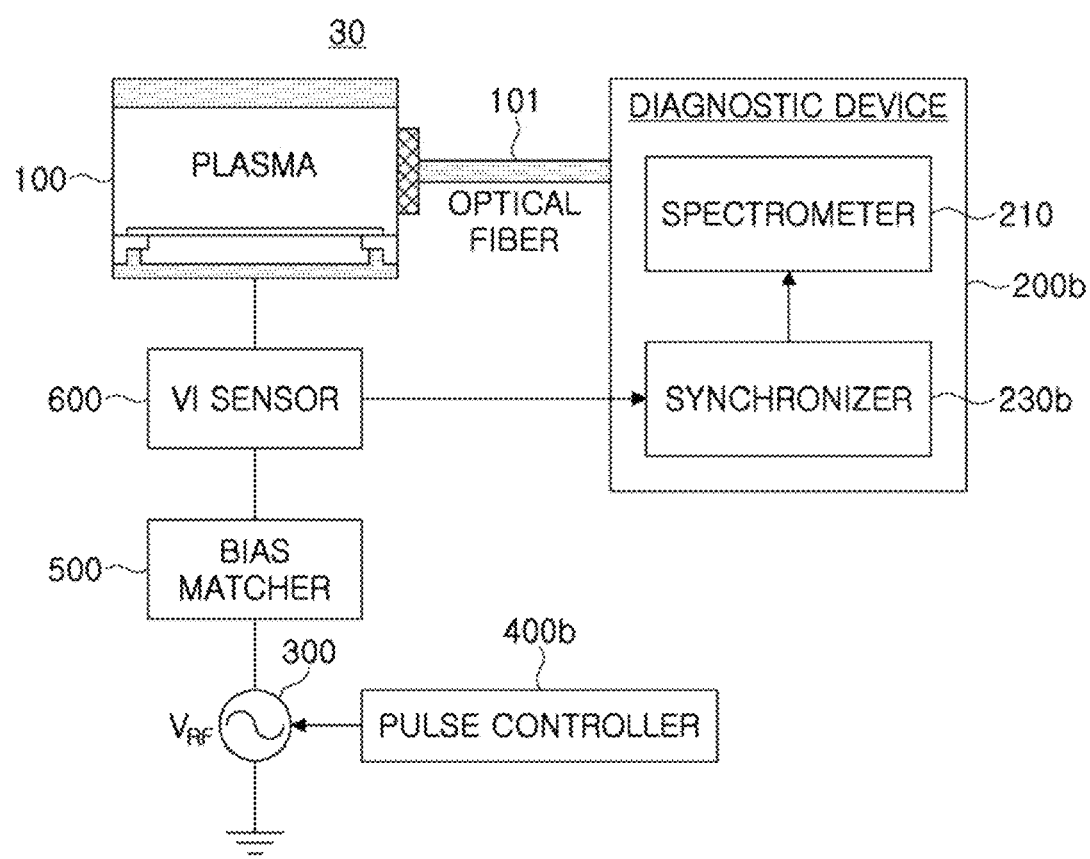
FIG. 10 is a view exemplarily illustrating a system for diagnosing a radical in a plasma processing chamber according to another example embodiment.

FIG. 10 is a view exemplarily illustrating a system for diagnosing a radical in a plasma processing chamber according to another example embodiment.

Referring to FIG. 10, a system for diagnosing a radical 30 may include the plasma processing chamber 100, a diagnostic device 200b, the multi-level pulse generator 300, a pulse controller 400b, the bias matcher 500, and a voltage-current sensor 600. The voltage-current sensor (VI sensor) 600 may be implemented to sense a voltage and current of the plasma processing chamber 100. The voltage-current sensor 600 may be implemented to synchronize with an envelope signal of the RF pulse signal.

Figure 11A:
FIGS. 11A, 11B, and 11C are diagrams exemplarily illustrating synchronization signals according to an example embodiment.
Figure 11B:
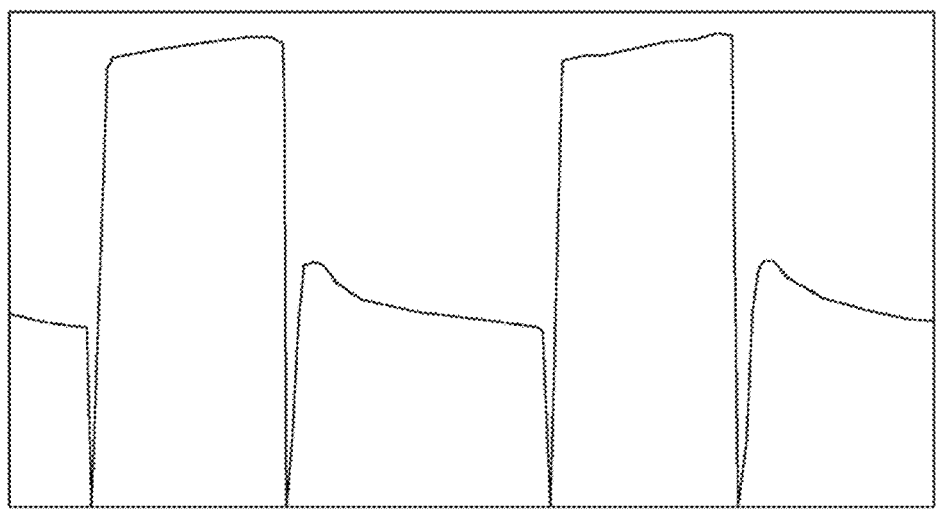
Figure 11C:
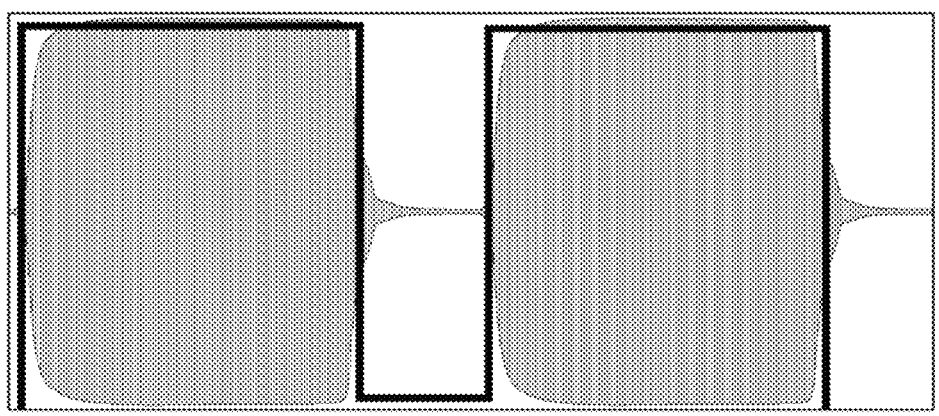

FIGS. 11A, 11B, and 11C are diagrams exemplarily illustrating synchronization signals according to an example embodiment.

Referring to FIG. 11A, a signal synchronized by an external trigger is illustrated.

Referring to FIG. 11B, a signal synchronized by an internal light sensor is illustrated.

Referring to FIG. 11C, a signal synchronized by the VI sensor is illustrated.

Figure 12:
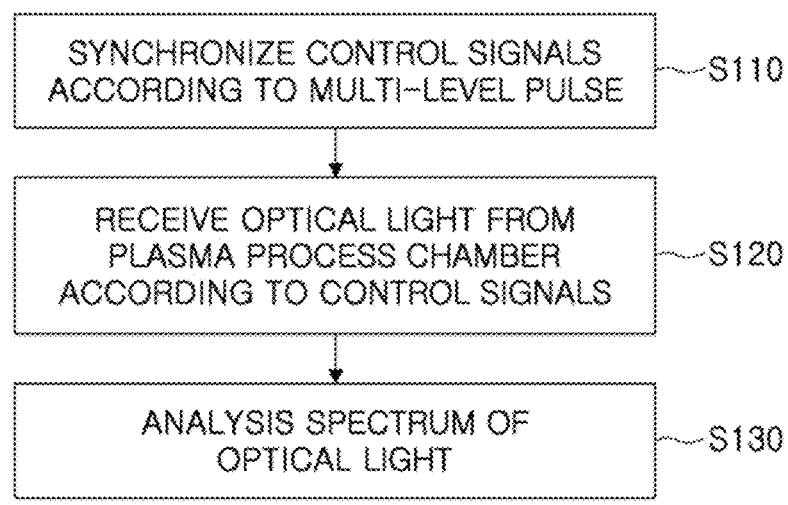
FIG. 12 is a diagram exemplarily illustrating a method of operating a diagnostic device according to an example embodiment.

FIG. 12 is a diagram exemplarily illustrating a method of operating a diagnostic device according to an example embodiment.

Referring to FIGS. 1 to 12, the diagnostic device according to an example embodiment may operate as follows.

The diagnostic device 200 may synchronize control signals by synchronizing with a multi-level pulse of the plasma processing chamber 100 (S110). Here, a synchronization operation of the control signals may be performed by an external trigger signal in response to each state of the multi-level pulse, by an internal sensor, or by an external sensor. For example, the control signals may be synchronized in response to an external trigger signal. The control signals may be synchronized by detecting an envelope of the optical signal. In addition, control signals may be synchronized in response to an envelope signal of each of the states of the multi-level pulse.

The diagnostic device 200 may receive an optical signal through an optical channel connected to the plasma processing chamber 100 according to the control signal (S120).

The diagnostic device 200 may obtain spectral data from the received optical signal, and analyze the obtained spectral data for each state (S130). In an example embodiment, the diagnostic device 200 may measure a dissociation rate and an extinction curve (including both recombination and decay) through spectral data analysis, and monitor a wall condition of a chamber through life-time analysis.

Figure 13:
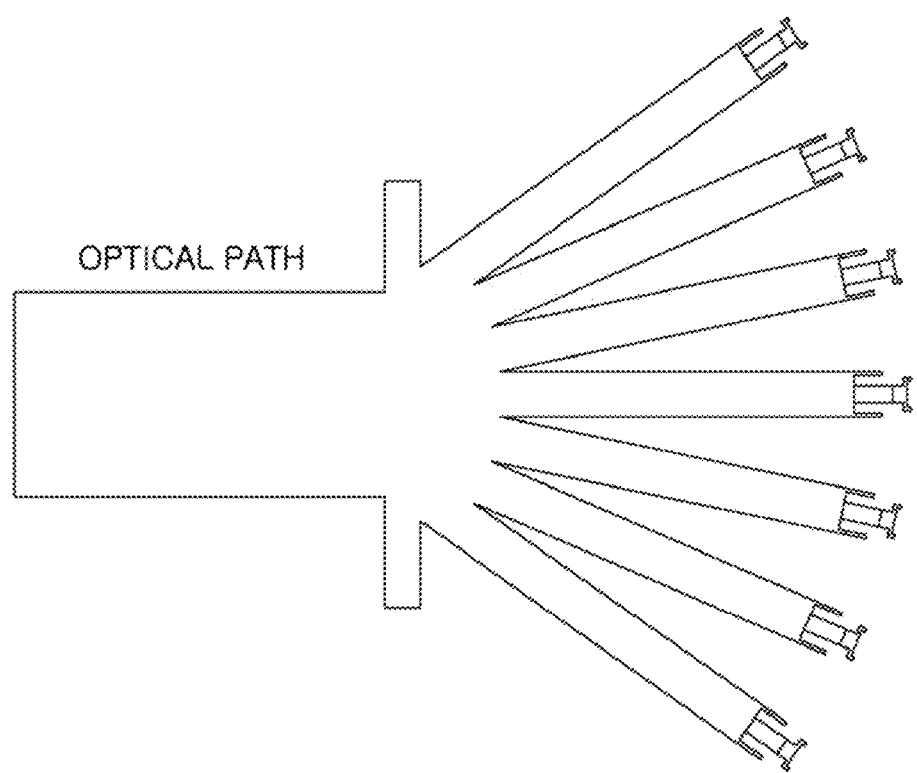
FIG. 13 is a view exemplarily illustrating a collimator according to an example embodiment.

FIG. 13 is a view exemplarily illustrating a collimator according to an example embodiment.

Referring to FIG. 13, the collimator may include a multi-focusing body connected to an optical path. The optical path may include anti clogging, a quartz window, a sealing cover, and an aperture and lens. The multi-focusing body may be implemented to receive information focused in each optical path using one lens.

Figure 14:
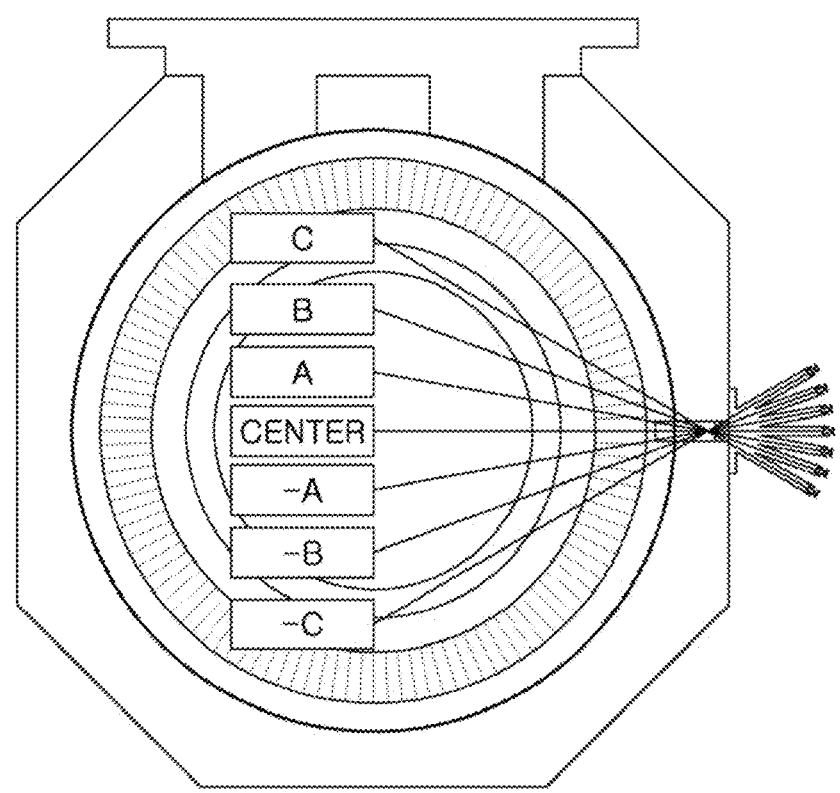
FIG. 14 is a diagram illustrating an optical path of a collimator in a plasma processing chamber.

FIG. 14 is a diagram illustrating an optical path of a collimator in a plasma processing chamber.

Referring to FIG. 14, seven optical paths (A, B, C, Center, −A, −B, and −C) may be disposed at predetermined intervals around a center. According to an example embodiment, the seven optical paths may be disposed at intervals of 6.95 degrees to 8.55 degrees (average 7.85 degrees) for each line. The seven optical paths may not be angled. For example, among the seven optical paths, a central portion thereof may be disposed at 8.55 degrees, a middle portion thereof may be disposed at 8.05 degrees, and both ends thereof may be disposed at 6.95 degrees (average of 7.85 degrees).

The number and interval of the optical paths of the collimator may be varied. For example, three to nine optical paths may be disposed in the collimator. When nine optical paths are disposed, the optical paths may be disposed at an interval of 5.2 degrees to 6.5 degrees (average 5.8875 degrees). When three optical paths are disposed, the optical paths may be disposed at an interval of 23.55 degrees.

Figure 15A:
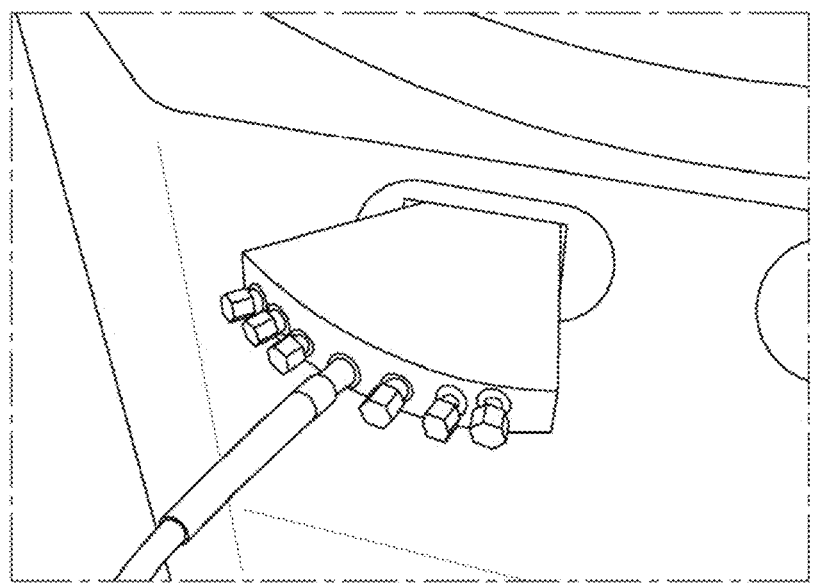
FIGS. 15A and 15B are diagrams exemplarily illustrating local analysis of radical using a 7-point optical collimator.
Figure 15B:
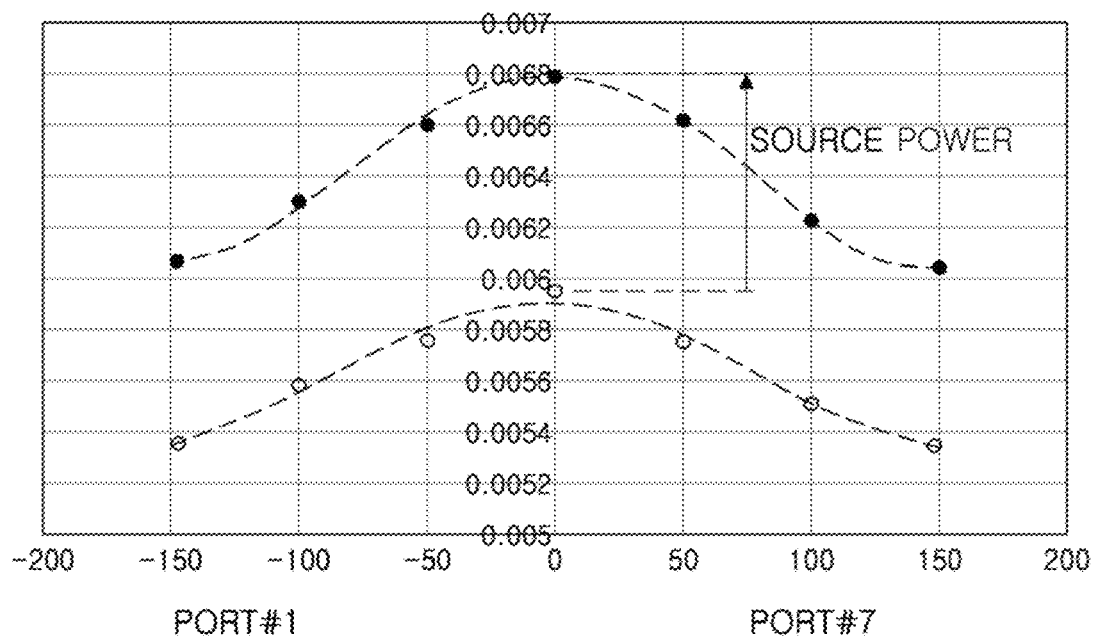

FIGS. 15A and 15B are diagrams exemplarily illustrating local analysis of a radical using a 7-point optical collimator as shown in FIG. 15A.

Referring to FIG. 15B, analysis of distribution of a radical and behavior thereof for each target port may be performed.

A plasma time-resolved analysis technique according to an example embodiment may be applied to a spectrotomography plasma diagnostic device. The spectrotomography plasma diagnostic device may be implemented by adding the multi-level pulsed plasma analysis apparatus of an example embodiment. The spectrotomography plasma diagnostic device of an example embodiment may analyze a plasma processing chamber with a temporal resolution by synchronizing the same with an RF multi-level pulse, which is a three-dimensional radical distribution analysis.

Figure 16A:
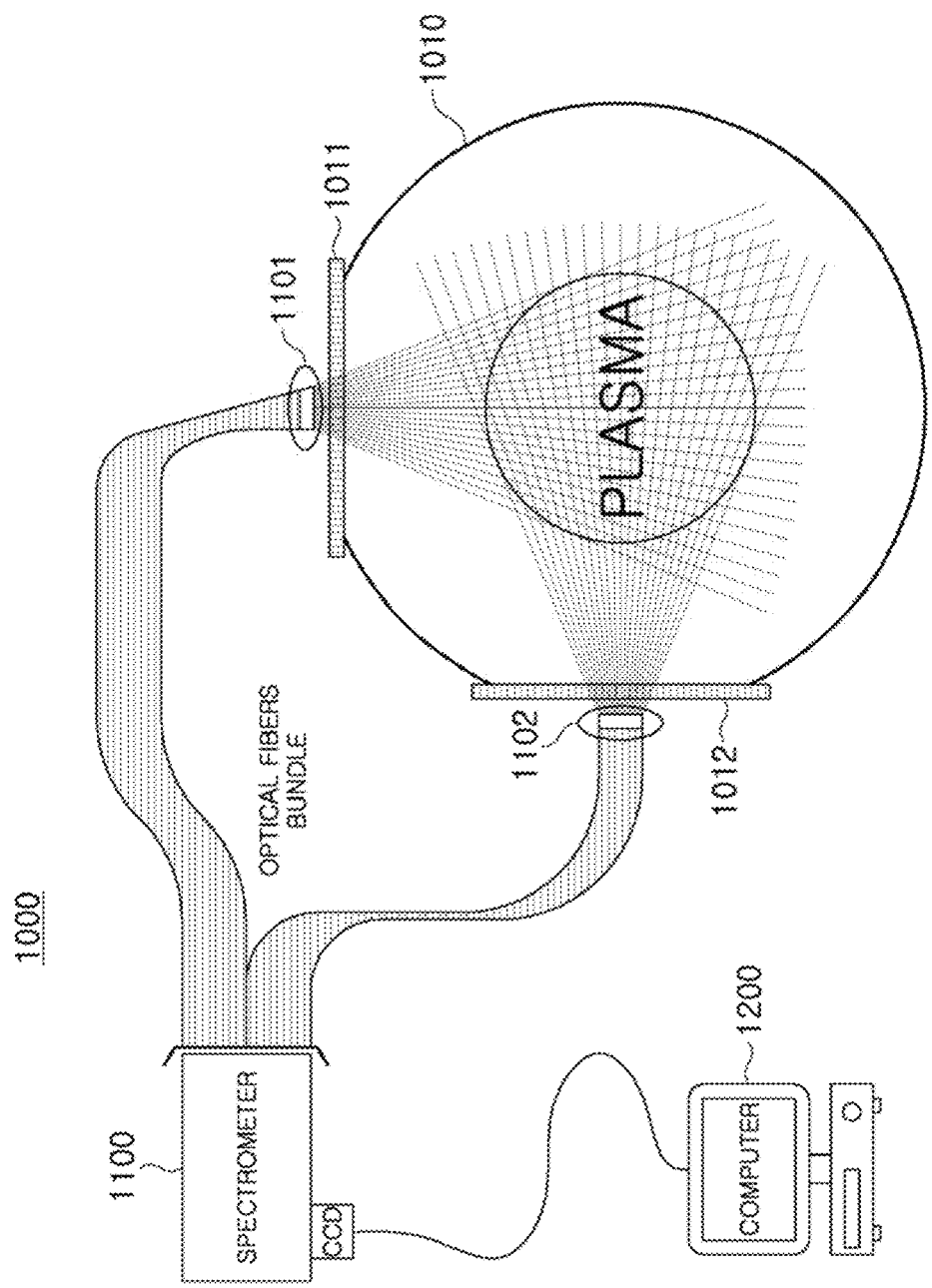
FIGS. 16A, 16B, and 16C are diagrams exemplarily illustrating a spectrotomography plasma diagnostic device according to an example embodiment.
Figure 16B:
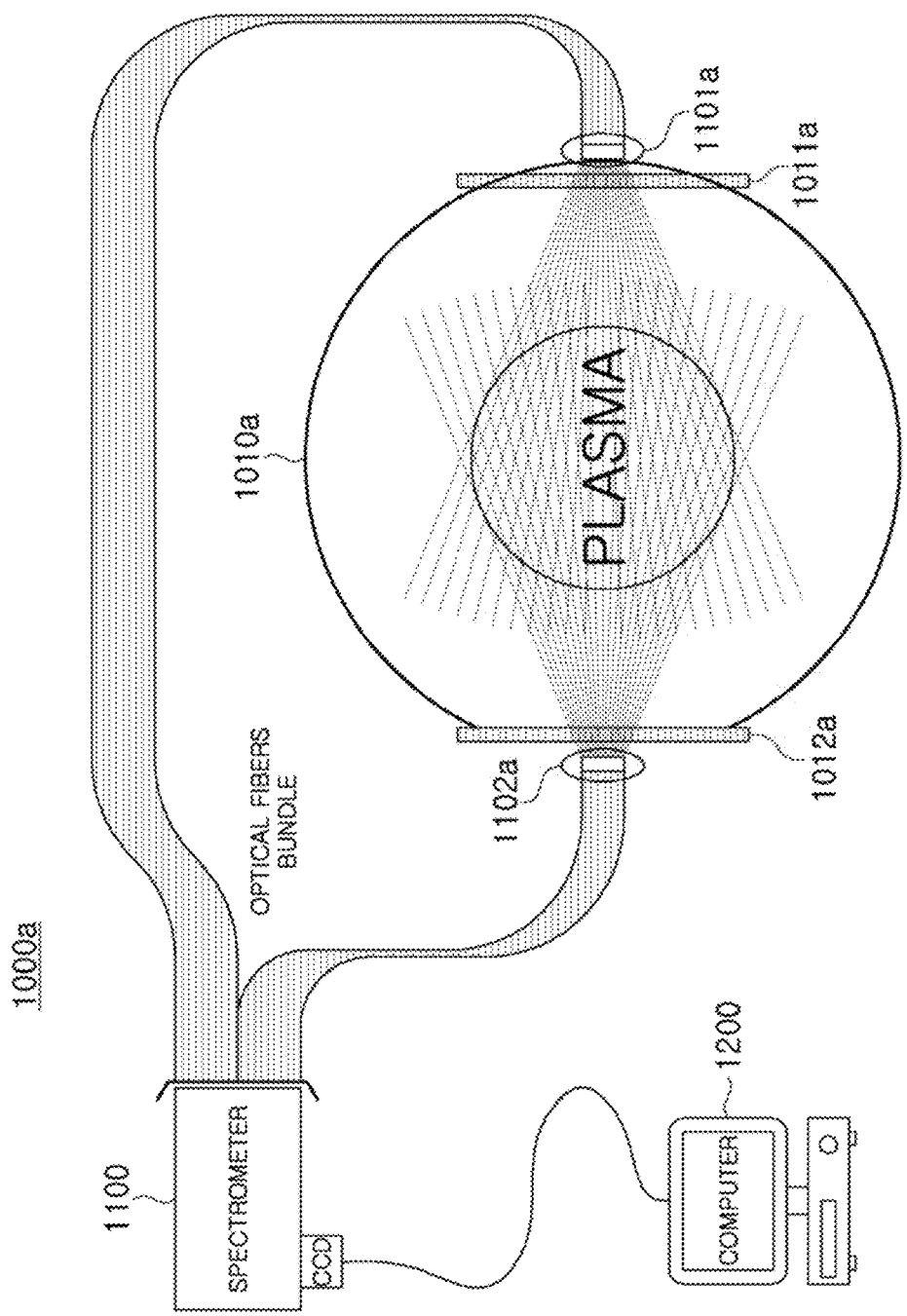
Figure 16C:
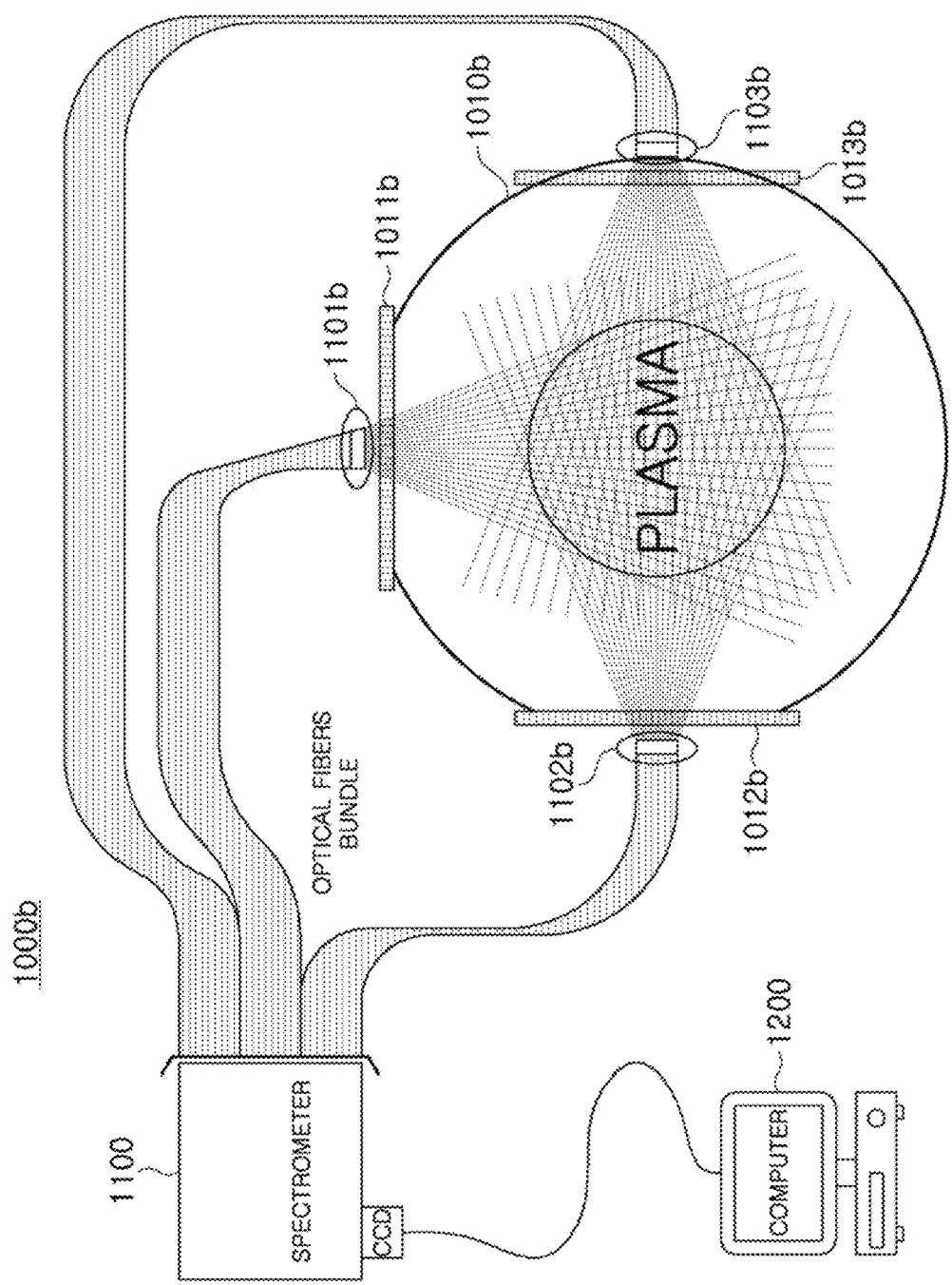

FIGS. 16A, 16B, and 16C are diagrams exemplarily illustrating a spectrotomography plasma diagnostic device according to an example embodiment.

Referring to FIG. 16A, a spectrotomography plasma diagnostic device 1000 may include a plasma processing chamber 1010, a spectrometer 1100, and a computing device 1200. The spectrometer 1100 may be connected to first and second collimators and mechanical holders 1101 and 1102 through an optical channel. The first and second collimators and mechanical holders 1101 and 1102 may be disposed on windows 1011 and 1012 disposed in different directions. The computing device 1200 may be implemented to analyze distribution of a radical or behavior of a radical by using spectrum data analyzed by the spectrometer 1100. The computing device 1200 may include at least one processor for driving a program and a memory device for storing the program.

The processor may be implemented to perform spectrum analysis related to distribution of a radical for each state of the multi-level pulses described with reference to FIGS. 1 to 12 or behavior of a radical. The processor may be configured to synchronize control signals in response to a synchronization signal corresponding to each of the states of the multi-level pulse, receive an optical signal in response to the control signals, and execute a series of instructions to perform spectrum analysis on the received optical signal. The memory may be implemented to store computer-readable instructions. As the instructions stored in the memory are executed by the processor, the aforementioned operations may be performed. The memory may be a volatile memory or a non-volatile memory. The memory may include a storage device to store user data.

In the spectrotomography plasma diagnostic device 1000 illustrated in FIG. 16A, windows 1011 and 1012 are disposed on upper and left sides of the plasma processing chamber 1010, but this may be varied.

Referring to FIG. 16B, windows 1011*a* and 1012*a* may be disposed on right and left sides of the plasma processing chamber 1010*a* in the spectrotomography plasma diagnostic device 1000*a*. An optical channel may be connected to each of the first and second collimators and mechanical holders 1101*a* and 1102*a* corresponding to each of the windows 1011*a* and 1012*a*.

Referring to FIG. 16C, in the spectrotomography plasma diagnostic device 1000*b*, windows 1011*b*, 1012*b*, and 1013*b* may be disposed on upper, left, and right sides of the plasma processing chamber 1010*b*. An optical channel may be connected to the first, second, and third collimators and mechanical holders 1101*b*, 1102*b*, and 1103*b* corresponding to each of the windows 1011*b*, 1012*b*, and 1013*b*.

The example embodiments described above may be implemented with a hardware component, a software component, and/or a combination of a hardware component and a software component. For example, the device, method, and component described in the example embodiments may be implemented using one or more general-purpose computers and special-purpose computers such as, processors, controllers, arithmetic logic units (ALUs), digital signal processors, microcomputers, field programmable gate arrays (FPGAs), programmable logic units (PLUs), microprocessors, or any other device capable of executing and responding to instructions. The processing device may execute an operating system (OS) and one or more software applications running on the operating system.

The processing device may also access, store, manipulate, process, and generate data in response to execution of the software. For convenience of understanding, it can be seen that, although one processing device is sometimes described as being used, one of ordinary skill in the art will recognize that the processing device may include a plurality of processing elements and/or a plurality of types of processing elements. For example, the processing device may include a plurality of processors or one processor and one controller. Other co-processor configurations are also possible, such as a Parallel Processor.

The software may include a computer program, code, instructions, or a combination of one or more thereof, and configure the processing device to operate as desired or command the processing device independently or collectively. Software and/or data may be permanently or temporarily embodied on any type of machine, component, physical device, virtual equipment, computer storage medium or device, or transmitted signal waves, to be interpreted by or provide instructions or data to the processing device. The software may be distributed over a computer system connected via a network, and stored or executed in a distributed manner. The software and data may be stored in one or more computer-readable recording media.

A spectrotomography plasma diagnostic device according to an example embodiment may enable a three-dimensional spatial distribution analysis of a change in behavior of a radical.

A diagnostic device according to an example embodiment may analyze the behavior of a radical and distribution thereof for each state of a plasma process facility using RF multi-level pulses. Due to an increase in a degree of directivity of semiconductor devices and an increase in the number of stacking stages, a high-level etching profile may be called for. A use of RF multi-level pulses and gas pulsing to satisfy these process characteristics is expanding. Embodiments may provide a technique for analyzing distribution of a radical and behavioral characteristics thereof for each state of a plasma process facility using RF multi-level pulses and gas pulsing.

A sensor controller and optical fiber according to an example embodiment may include an image sensor driver and conversion board, and a synchronization module. The synchronization module may be a device receiving an external trigger signal and an internal/external sensor optical/electrical signal to synchronize the same. The sensor controller and optical fiber may further include a fast time photo meter. The fast time photo meter may enable plasma pulse shape diagnosis. In an example embodiment, the spectrometer may be implemented with a gate type CCD or CMOS image sensor and a grating type optic bench (spectrometer).

In an apparatus for diagnosing a radical in a plasma processing chamber and an operating method thereof according to an example embodiment, in a state in synchronization with each state of an RF multi-level pulse, electronic-shuttering may be performed by controlling a storage, transfer, and reset gate of CCD/CMOS image sensor. Accordingly, spectral data of plasma may be obtained for each state. In addition, a three-dimensional simultaneous analysis of emission distribution and behavioral characteristics of radicals for each state of the RF multi-level pulse may be performed. Thus, analysis of spectrum of radicals may be performed. In addition, it may be possible to characterize the behavior (creation and extinction) of radicals for each state.

As set forth above, according to an example embodiment, in a device for diagnosing radicals in a plasma processing chamber, a system for diagnosing radicals including the same, and an operating method thereof, by providing a spectrometer using an image sensor, distribution a radical and behavior of the radical may be analyzed in real time.

Herein, terms such as a lower side, a lower portion, a lower surface, and the like, may be used to refer to a direction toward a mounting surface in relation to cross-sections of the drawings, while an upper side, an upper portion, an upper surface, and the like, may be used to refer to an opposite direction to the direction. However, these directions are defined for convenience of explanation, and the claims are not particularly limited by the directions defined as described above.

The meaning of a "connection" of a component to another component in the description includes an indirect connection through an adhesive layer as well as a direct connection between two components. In addition, "electrically connected" conceptually includes a physical connection and a physical disconnection. It can be understood that when an element is referred to with terms such as "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an example embodiment" used herein does not refer to the same example embodiment, and is provided to emphasize a particular feature or characteristic different from that of another example embodiment. However, example embodiments provided herein are considered to be able to be implemented by being combined in whole or in part one with one another. For example, one element described in a particular example embodiment, even if it is not described in another example embodiment, may be understood as a description related to another example embodiment, unless an opposite or contradictory description is provided therein.

Terms used herein are used only in order to describe an example embodiment rather than limiting the present disclosure. In this case, singular forms include plural forms unless interpreted otherwise in context.

By way of summation and review, a pulsed plasma apparatus may be coupled to a plasma processing chamber through a matching network. The matching network may minimize reflected power of the plasma processing chamber to maximize an amount of power by which an output of the RF power source is coupled to the plasma. The matching network may match complex impedance of the plasma, typically 50Ω. The matching network may be dynamically tuned with power from an RF power generator or an RF power source. To facilitate dynamic matching as plasma properties change, e.g., while an etching process is performed, the matching network may be continuously adjustable to ensure that matching is achieved and maintained throughout the process. Pulse power may be combined with process gases inside a plasma processing chamber from an electrode in the plasma processing chamber to form plasma used in the etching process.

As described above, embodiments may provide a device for diagnosing a radical in a plasma processing chamber capable of performing spectral analysis in real time in each of states of a multi-level pulse, a system for diagnosing a radical including the same, and an operating method thereof.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

The invention claimed is:

1. A diagnostic device for diagnosing distribution of radicals in a plasma processing chamber, the diagnostic device comprising:
   a spectrometer configured to receive an optical signal through at least one optical channel connected to the plasma processing chamber, and to perform spectral analysis on the optical signal in response to a synchronization signal corresponding to each state of a plurality of states of a multi-level pulse applied to the plasma processing chamber;
   an internal sensor configured to detect an envelope of the optical signal; and
   a synchronizer configured to generate the synchronization signal corresponding to each state of the plurality of states of the multi-level pulse,
   wherein during each state a different process is conducted in the plasma processing chamber,
   wherein the synchronizer is configured to generate the synchronization signal according to the detection of the envelope of the internal sensor, and
   wherein the internal sensor includes a fast time photo meter.

2. The diagnostic device as claimed in claim 1, wherein the spectrometer includes an image sensor.

3. The diagnostic device as claimed in claim 2, wherein the image sensor is a complementary metal oxide semiconductor (CMOS) image sensor or a charge coupled device (CCD) image sensor.

4. The diagnostic device as claimed in claim 2, wherein the image sensor is configured to perform electronic-shuttering by controlling a storage operation, a transfer operation, and a reset gate operation for each of the states of the multi-level pulse.

5. The diagnostic device as claimed in claim 2, wherein the image sensor includes:
   a pixel array having a plurality of pixels; and
   a control board configured to receive the synchronization signal from the synchronizer, and to generate control signals for controlling each of the plurality of pixels.

6. The diagnostic device as claimed in claim 1, wherein the synchronizer is configured to generate the synchronization signal according to a trigger signal of a pulse controller, the pulse controller being configured to control generation of the multi-level pulse.

7. The diagnostic device as claimed in claim 1, further comprising a voltage-current sensor configured to measure a voltage or a current in synchronization with an envelope signal of the multi-level pulse,
   wherein the synchronizer is configured to generate the synchronization signal according to control of the voltage-current sensor.

8. The diagnostic device as claimed in claim 1, wherein the at least one optical channel includes seven optical channels, which are respectively output from collimators of the plasma processing chamber.

9. A radical diagnostic system, comprising:
a plasma processing chamber;
a multi-level pulse generator configured to apply a multi-level pulse to the plasma processing chamber;
a pulse controller configured to control the multi-level pulse generator;
a bias matcher configured to minimize reflected power reflected from the plasma processing chamber; and
a diagnostic device connected to the plasma processing chamber through at least one optical channel, and configured to receive an optical signal through the at least one optical channel, and to diagnose radicals or analyze behavior of the radicals by performing spectral analysis of the optical signal for each state of a plurality of states of the multi-level pulse,
wherein during each state a different process is conducted in the plasma processing chamber,
wherein the diagnostic device includes an internal sensor configured to detect an envelope of the optical signal,
wherein the diagnostic device includes a synchronizer configured to generate a synchronization signal according to the detection of the envelope of the internal sensor, and
wherein the internal sensor includes a fast time photo meter.

10. The radical diagnostic system as claimed in claim 9, wherein the synchronization signal corresponds to each of the states of the multi-level pulse.

11. The radical diagnostic system as claimed in claim 10, wherein the synchronizer is configured to generate the synchronization signal by an external trigger signal, the internal sensor, or an external sensor.

12. The radical diagnostic system as claimed in claim 11, wherein the pulse controller is configured to generate the trigger signal.

13. The radical diagnostic system as claimed in claim 9, wherein the diagnostic device includes a CCD or CMOS image sensor for receiving the optical signal.

14. An operating method of a diagnostic device for diagnosing distribution of radicals in a plasma processing chamber, the method comprising:
synchronizing control signals according to a multi-level pulse applied to the plasma processing chamber;
receiving an optical signal from the plasma processing chamber, by operating a pixel of an image sensor according to the control signals; and
performing spectral analysis on the optical signal to analyze distribution of radicals and behavior of the radicals for each state of a plurality of states of the multi-level pulse,
wherein during each state a different process is conducted in the plasma processing chamber,
wherein the diagnostic device includes an internal sensor configured to detect an envelope of the optical signal,
wherein the diagnostic device includes a synchronizer configured to generate a synchronization signal according to the detection of the envelope of the internal sensor, and
wherein the internal sensor includes a fast time photo meter.

15. The method as claimed in claim 14, wherein the synchronizing of the control signals includes synchronizing the control signals in response to an external trigger signal.

16. The method as claimed in claim 14, wherein the synchronizing of the control signals includes synchronizing the control signals by detecting the envelope of the optical signal.

17. The method as claimed in claim 14, wherein the synchronizing of the control signals includes synchronizing the control signals in response to an envelope signal of each of the states of the multi-level pulse.

18. The method as claimed in claim 14, wherein the analyzing of the spectrum includes:
measuring a dissociation rate, and a recombination and/or decay; and
monitoring a wall condition through a life-time analysis of the radicals.

* * * * *